(12) United States Patent
Tominaga et al.

(10) Patent No.: US 7,955,122 B2
(45) Date of Patent: Jun. 7, 2011

(54) CONDUCTIVE CONTACT UNIT

(75) Inventors: Jun Tominaga, Kanagawa (JP); Koji Ishikawa, Kanagawa (JP); Taiichi Rikimaru, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 358 days.

(21) Appl. No.: 12/224,444

(22) PCT Filed: Mar. 1, 2007

(86) PCT No.: PCT/JP2007/053950
§ 371 (c)(1),
(2), (4) Date: Aug. 27, 2008

(87) PCT Pub. No.: WO2007/100059
PCT Pub. Date: Sep. 7, 2007

(65) Prior Publication Data
US 2009/0026050 A1    Jan. 29, 2009

(30) Foreign Application Priority Data

Mar. 3, 2006  (JP) ................................ 2006-058643

(51) Int. Cl.
*H01R 13/24*   (2006.01)
*H01R 13/11*   (2006.01)
*G01R 31/00*   (2006.01)

(52) U.S. Cl. .................. 439/482; 439/607.45; 439/700; 439/842; 324/755.05; 324/755.08; 324/756.01; 324/756.04

(58) Field of Classification Search .......... 324/754–758, 324/761, 762, 72.5; 439/482, 700, 840, 841, 439/607.45, 733.1, 66, 71, 844, 72, 73, 824
See application file for complete search history.

(56) References Cited

U.S. PATENT DOCUMENTS

| 4,773,877 | A | * | 9/1988 | Kruger et al. ................. 439/482 |
| 5,865,641 | A | * | 2/1999 | Swart et al. ................... 439/482 |
| 5,967,856 | A | * | 10/1999 | Meller .......................... 439/700 |

(Continued)

FOREIGN PATENT DOCUMENTS

JP    08-075786    3/1996

(Continued)

OTHER PUBLICATIONS

International Search Report mailed May 15, 2007, issued on PCT/JP2007/053950.

*Primary Examiner* — Michael A Friedhofer
(74) *Attorney, Agent, or Firm* — Edwards Angell Palmer & Dodge LLP

(57) ABSTRACT

A conductive contact unit includes a conductive contact holder, a conductive contact, and an aligning unit. The conductive contact holder includes a first guiding grooves and a second guiding groove opposite to the first guiding groove, each slidably engaging one edge of the conductive contact. The conductive contact has a plate-like shape, and includes a first contacting element and a second contacting element that are brought into contact with different circuitries, a resilient element that is expandable and contractible in a longitudinal direction between the first contacting element and the second contacting element, a first connecting element that connects the resilient element and the first contacting element, and a second connecting element that connects the resilient element and the second contacting element. The aligning unit aligns the conductive contacts.

14 Claims, 15 Drawing Sheets

U.S. PATENT DOCUMENTS

| | | | |
|---|---|---|---|
| 5,990,697 A | 11/1999 | Kazama et al. | |
| 6,783,405 B1 * | 8/2004 | Yen | 439/824 |
| 6,859,054 B1 * | 2/2005 | Zhou et al. | 324/754 |
| 6,967,492 B2 * | 11/2005 | Tsui et al. | 324/754 |
| 7,179,133 B2 * | 2/2007 | Forell et al. | 439/700 |
| 7,335,068 B2 * | 2/2008 | Dwan et al. | 439/700 |
| 7,560,943 B2 * | 7/2009 | Kim et al. | 324/754 |
| 7,789,707 B2 * | 9/2010 | Tominaga et al. | 439/607.45 |

FOREIGN PATENT DOCUMENTS

| | | |
|---|---|---|
| JP | 10-019930 | 1/1998 |
| JP | 10-132853 | 5/1998 |
| JP | 11-133060 | 5/1999 |
| JP | 2000-046870 | 2/2000 |
| JP | 2001-324515 | 11/2001 |
| JP | 2001-343397 | 12/2001 |
| JP | 2002-257893 | 9/2002 |

* cited by examiner

CONDUCTIVE CONTACT UNIT

CROSS REFERENCE TO RELATED APPLICATIONS

This application is related to co-pending application: "CONDUCTIVE CONTACT UNIT" filed even date herewith in the names of Jun TOMINAGA, Koji ISHIKAWA and Taiichi RIKIMARU as a national phase entry of PCT/JP2007/053951; which application is assigned to the assignee of the present application and it is incorporated by reference herein.

Technical Field

The present invention relates to a conductive contact unit that is brought into contact with an electrode or a terminal of an electronic component and transmits and receives an electrical signal upon testing the conducting state and operating characteristics of the electronic component such as a liquid crystal panel or a semiconductor integrated circuit.

Background Art

In a technological field of electrical characteristic testing of a test object such as a semiconductor integrated circuit, there is a known technology related to a conductive contact unit. The conductive contact unit includes a plurality of conductive contacts (probes), each of which is arranged correspondingly to a connecting terminal of the semiconductor integrated circuit, and provides electrical conductivity by bringing the conductive contacts into physical contact with the connecting terminals. A structure of the conductive contact includes at least the conductive contacts and a conductive contact holder for holding the conductive contacts. Along with a trend to miniaturize the semiconductor integrated circuit that is a test object, various technologies have been provided for the conductive contact unit to narrow the intervals between the arranged conductive contacts so that smaller intervals of connecting terminal arrangement can be accommodated.

As one of the examples of the conductive contacts that achieve narrower arrangement intervals, there has been provided a plate-shaped conductive member structure that is integrated with a contacting element that is brought into contact with the test object, and an resilient element that urges a snapping force to the contacting element. By arranging the plate-like conductive contacts in a through-thickness direction, it becomes theoretically possible, according to this technology, to arrange a number of conductive contacts in a small space. In this manner, a conductive contact that can support the narrower arrangement intervals of the connecting terminals of the test object can be achieved. (For example, see Patent Document 1 listed below.)

[Patent Document 1] Japanese Patent Application Laid-open Number 2001-343397

[Patent Document 2] Japanese Patent Application Laid-open Number H10-132853

DISCLOSURE OF INVENTION

Problem to be Solved by the Invention

In a conductive contact unit arranged such that a conductive contact holder includes guides and conductive contacts are inserted between the guides, a clearance is present between each conductive contact and each guide. Thus, when the conductive contact is being in contact with the guide and generates a load, a contact position of each of the conductive contacts and the guides varies, causing variation in frictional force. This leads to a possibility that a stable test signal cannot be supplied to a test object.

The present invention has been achieved to solve the above problems in the conventional technology and it is an object of the present invention to provide a conductive contact unit capable of reducing variation in frictional force generated between conductive contacts and the guides, and stably supplying a test signal.

Means for Solving Problem

According to an aspect of the present invention, a conductive contact unit may establish an electrical connection between different circuitries, and include a plurality of conductive contacts that receive and output an electrical signal from and to the circuitries, respectively. The conductive contact unit may include a conductive contact holder, the conductive contacts, and an aligning unit. The conductive contact holder may include a plurality of first guiding grooves each slidably engaging one edge in a width direction of one of the conductive contacts to hold the conductive contact, and a plurality of second guiding grooves each located opposite to corresponding one of the first guiding grooves, and slidably engaging another edge of the conductive contact than the one the corresponding first guiding groove engages to hold the conductive contact. Each of the conductive contacts may have a plate-like shape, and include a first contacting element that is brought into physical contact with one of the different circuitries, a second contacting element that is brought into physical contact with one of the different circuitries other than the one the first contacting element is brought into contact with, a resilient element that is interposed between the first contacting element and the second contacting element, and is expandable and contractible in a longitudinal direction, a first connecting element that connects the resilient element and the first contacting element, and a second connecting element that connects the resilient element and the second contacting element. The aligning unit that aligns the conductive contacts.

In the conductive contact unit, one edge in the width direction of the conductive contacts aligned by the aligning unit may be in contact with corresponding one of the first guiding grooves or corresponding one of the second guiding grooves.

In the conductive contact unit, one edge in the width direction of the conductive contacts aligned by the aligning unit may be in contact with neither corresponding one of the first guiding grooves nor corresponding one of the second guiding grooves.

In the conductive contact unit, the conductive contacts may include a magnetic material, and the aligning unit may include a magnet attached to a side wall of the conductive contacts.

In the conductive contact unit, the magnet may be an electromagnet.

In the conductive contact unit, the conductive contacts may include a magnetic material. The aligning unit may include a supporting element that supports the first guide grooves and the second guide grooves, and a magnet that is embedded in the supporting element, and that constitutes a magnetic circuit with the conductive contact holder.

In the conductive contact unit, the magnet may be an electromagnet.

In the conductive contact unit, the conductive contact holder may include holes communicating from bottom surfaces of the first guiding grooves or the second guiding grooves to outside of the conductive contact holder, and the aligning unit may include a sucking section that sucks air inside the conductive contact holder through the holes.

In the conductive contact unit, the first connecting element and/or the second connecting element may include an opening penetrating therethrough in a through-thickness direction. The aligning unit may include a bar-shaped member that penetrates through the opening of each of the conductive contacts held in the conductive contact holder, and that moves the conductive contacts together relative to the conductive contact holder at one time.

In the conductive contact unit, at least a portion of the second contacting element may project from an external surface of the conductive contact holder, inside which the guiding grooves are formed, in a normal direction of the external surface.

According to an aspect of the present invention, it is possible to reduce variation in friction force generated between the conductive contacts and the guides, and to supply a test signal stably.

BRIEF DESCRIPTION OF DRAWINGS

FIG. 7-1 is a diagram of the conductive contact unit according to the first embodiment immediately after being brought into contact with a test object.

FIG. 7-2 is a diagram of the conductive contact unit according to the first embodiment with the test object elevated to a test position.

FIG. 16-1 is a diagram of a conductive contact unit according to a modification of the fourth embodiment of the present invention immediately after being brought into contact with a test object.

FIG. 16-2 is a diagram of the conductive contact unit according to a modification of the fourth embodiment of the present invention with the test object elevated to a test position.

Figure 1:
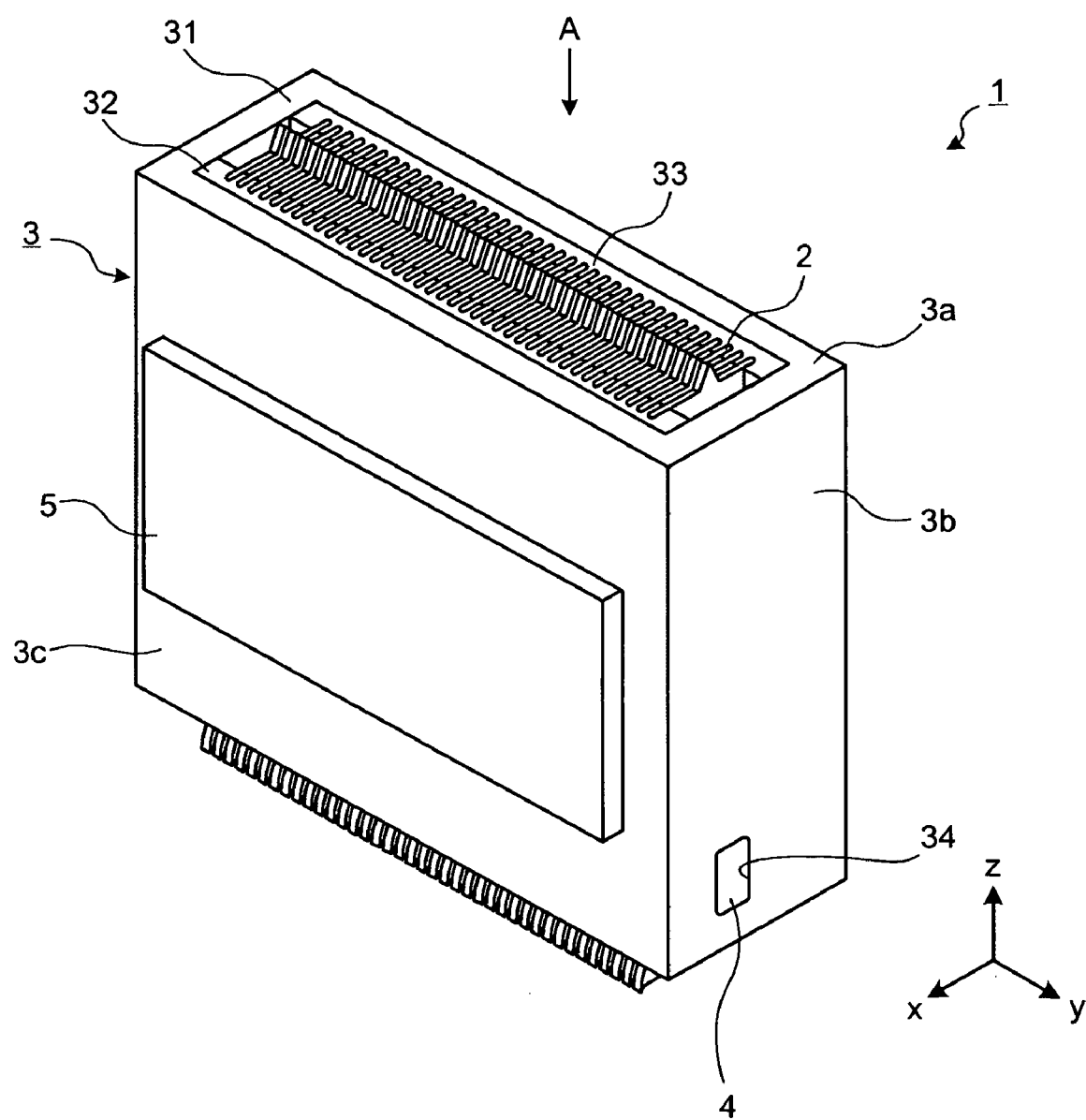
FIG. 1 is a perspective view of a structure of a conductive contact unit according to a first embodiment of the present invention.

EXPLANATIONS OF LETTERS OR NUMERALS 1, 6, 8, 9, 51 conductive contact unit
2 conductive contact
3, 7, 10 conductive contact holder
3a upper wall
3b, 3c side wall
3d bottom wall
4, 11, 12 bar-shaped member
5, 72 magnet
21 first contacting element
22 second contacting element
23 resilient element
24 first connecting element
25 second connecting element
26 opening
31, 71, 81, 101 supporting element
32, 82 first guiding member
33, 83 second guiding member
34, 102 fastening hole
84 flow path
85 large flow path
86 coupling section
87 sucking section
321, 331, 821, 831 guiding groove
201 circuit board
202 fixing member
203 test object
$L_1$, $L_2$, L3 characteristic curve
$P_1$ initial contacting point
$P_2$ final contacting point
$\Delta_1$ offset
$\delta_1$, h projected length

BEST MODE(S) FOR CARRYING OUT THE INVENTION

Best modes for carrying out the present invention (hereinafter, "embodiments") are described below with reference to the attached drawings. It should be noted that the drawings are just schematic representations, and that the relation between the thickness and width of each element, or a thickness ratio of each element may be different from those actually measured. Moreover, it should be obvious that the relationship or ratio of dimensions may be different in each of the drawings.

First Embodiment

FIG. 1 is a perspective view of a structure of a conductive contact unit according to a first embodiment of the present invention. A conductive contact unit 1 shown in FIG. 1 is used for testing the conductive state or operating characteristics of testing a circuitry, such as a liquid crystal panel that is a test object. The conductive contact unit 1 includes a plurality of conductive contacts 2 each having a plate-like shape, a conductive contact holder 3 that accommodates and holds the conductive contacts 2, a bar-shaped member 4 that is fastened to the conductive contact holder 3 and supports the conductive contacts 2, a magnet 5 that is attached to a side wall 3c of the conductive contact holder 3.

Figure 2:
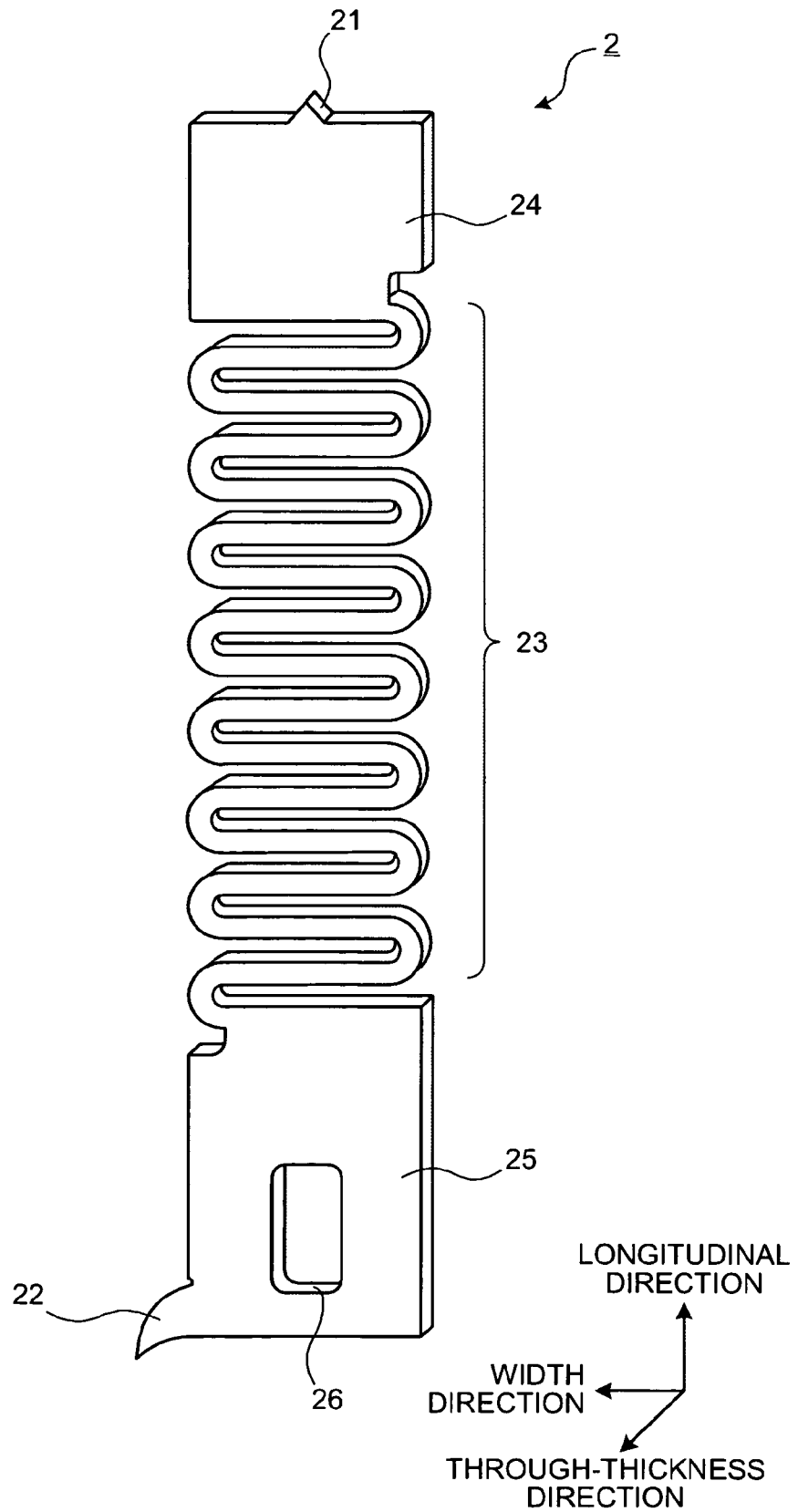
FIG. 2 is a diagram of a structure of a conductive contact.

The conductive contact 2 is described in detail below. FIG. 2 is a diagram of a structure of the conductive contact 2. The vertical direction in FIG. 2 is hereinafter referred to as a "longitudinal direction of the conductive contact 2", the horizontal direction in FIG. 2 is hereinafter referred to as a "width direction of the conductive contact 2", and the direction perpendicular to the longitudinal direction and the width direction is hereinafter referred to as a "through-thickness (thickness) direction of the conductive contact 2", respectively.

The conductive contact 2 shown in FIG. 2 establishes an electrical connection between different circuitries. The conductive contact 2 includes: a first contacting element 21 that is brought into physical contact with a predetermined circuitry (specifically, a flexible board to be supplied a test signal); a second contacting element 22 that is brought into physical contact with a circuitry other than that brought into contact with the first contacting element 21 (specifically, a test object such as a liquid crystal display); an resilient element 23 that is interposed between the first contacting element 21 and the second contacting element 22, and is extensible in the longitudinal direction; a first connecting element 24 having the same width and thickness as the resilient element 23, and connecting the first contacting element 21 and the resilient element 23; and a second connecting element 25 having the same width and thickness as the resilient element 23, connecting the second contacting element 22 and the resilient element 23, and having an opening 26 penetrating therethrough in the through-thickness direction. The second contacting element 22 further projects from a width-direction edge of the second connecting element 25 in the width direction.

The conductive contact 2 is formed by etching nickel (Ni) based thin foil having conductive and magnetic properties. The surface of the conductive contact 2 may partly or entirely be formed using a nonmagnetic layer such as an insulating layer. The first connecting element 24 and the second connecting element 25 may be different in width and/or thickness from the resilient element 23.

The conductive contact holder 3 is described below. The conductive contact holder 3 includes: a supporting element 31 having an approximately cubic shape with a hollow portion; a first guiding member 32 and a second guiding member 33, attached to the hollow portion of the supporting element 31 to face each other, for guiding a plurality of conductive contacts; and fastening holes 34, formed at predetermined positions on respective side walls 3b facing each other with the supporting element 31 in between, for fastening ends of the bar-shaped member 4.

Figure 3:
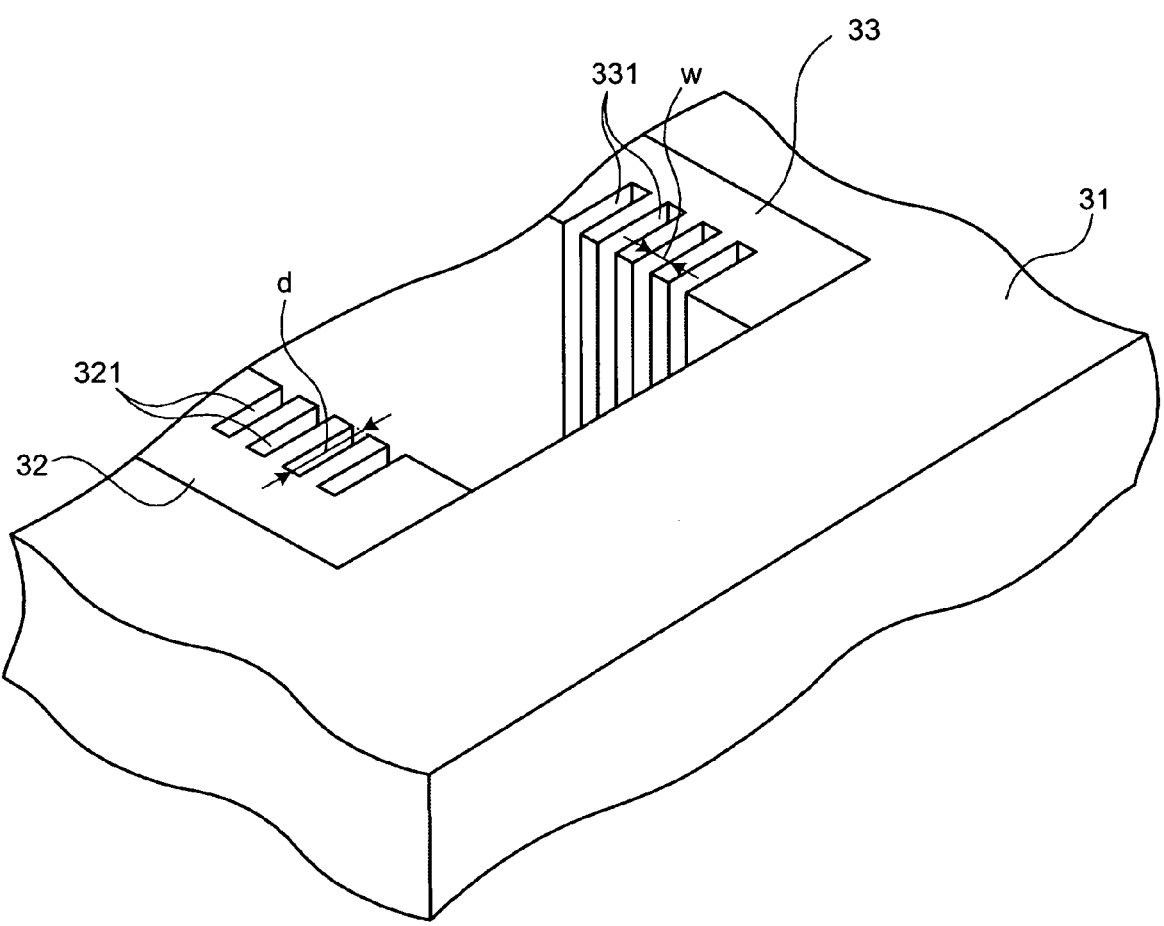
FIG. 3 is a partial enlarged perspective view of an upper wall of a conductive contact holder.

FIG. 3 is a partial enlarged perspective view of an upper wall 3a of the conductive contact holder 3. As shown in FIG. 3, the first guiding member 32 includes a plurality of linear guiding grooves 321 (first guiding grooves) that engage and hold one edges in the width direction of the conductive contacts 2 in a slidable manner when the conductive contacts 2 are mounted. The second guiding member 33 includes a plurality of linear guiding grooves 331 (second guiding grooves.) that are positioned facing the guiding grooves 321 of the first guiding member 32, and engage and hold the other edges of the conductive contacts 2 that are embedded in the width direction in the guiding grooves 321 in a slidable manner. The guiding grooves 321 and the guiding grooves 331 that are formed in pairs, function to align the conductive contacts 2 in a planar direction intersecting perpendicularly with the longitudinal direction, and to guide the extending action of the conductive contacts 2. The adjacent pairs of the guiding grooves 321 and the guiding grooves 331 have the same intervals, and are positioned in parallel to each other.

Each of the guiding grooves 321 and the guiding grooves 331 has the same groove width (denoted as "w"), and the same groove depth (denoted as "d"). The groove depth is sufficient if the conductive contact 2 is held firmly without becoming loose. Therefore, in this sense, the groove depth of the guiding groove 321 may be different from that of the guiding groove 331.

The groove depth (w) of each guiding groove is slightly larger than the thickness of the conductive contact 2. Further, a distance between groove bottoms of the facing guiding grooves 321 and 331 is slightly larger than the width of the conductive contact 2. In this way, clearance is present between the conductive contact 2 and the conductive contact holder 3, allowing the conductive contact 2 to move freely, not being restricted in the guides.

Figure 4:
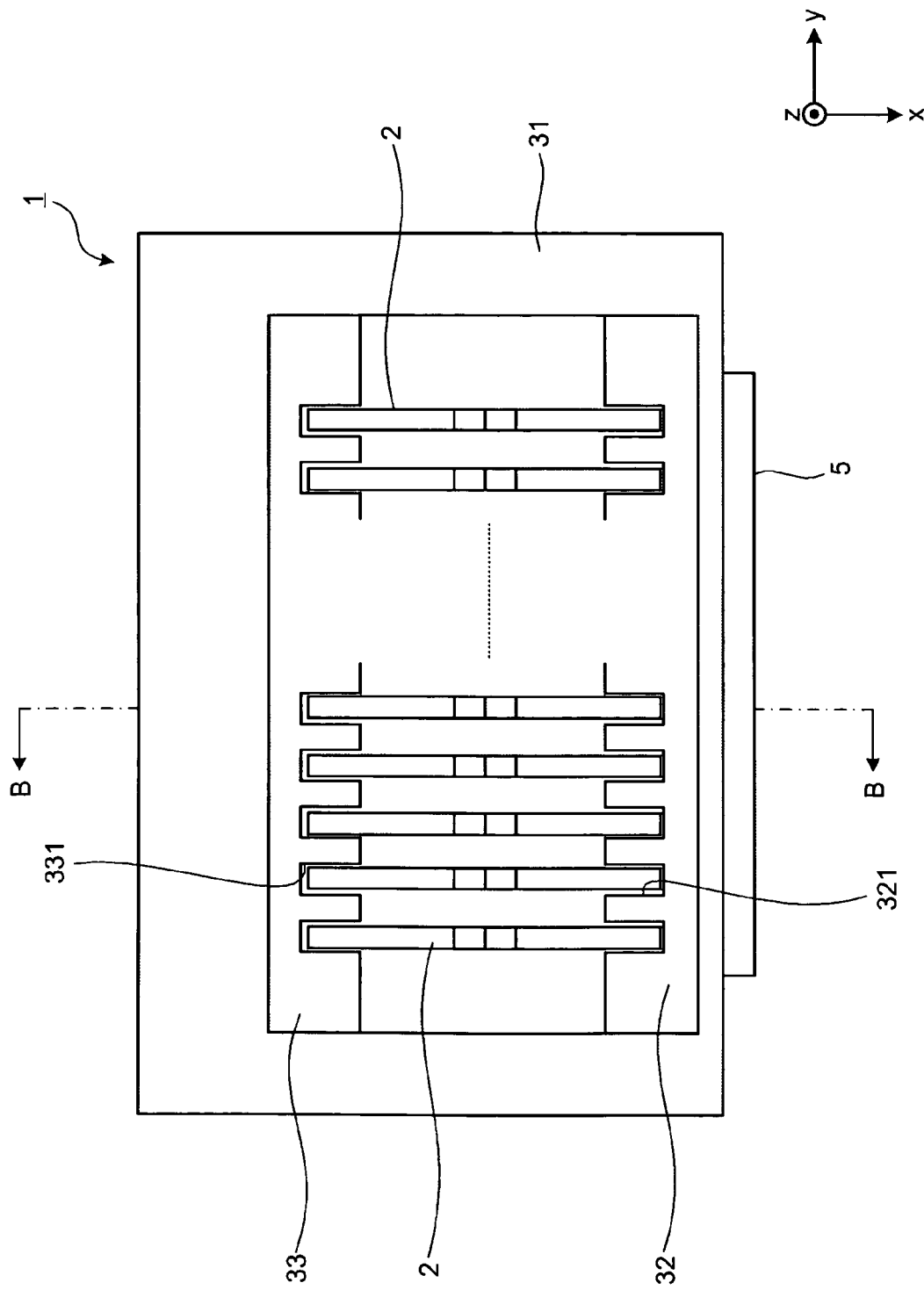
FIG. 4 is a view in a direction indicated by an arrow A shown in FIG. 1.

FIG. 4 is a top view in a direction indicated by an arrow A in FIG. 1. In the first embodiment, the conductive contacts 2 are formed using a magnetic material. Thus, affected by the magnet 5, the conductive contacts 2 are aligned substantially uniformly, being in contact with the bottom of the guiding grooves 321 of the first guiding member 32. In this sense, the magnet 5 has functions as an aligning unit that aligns the conductive contacts 2 held in the conductive contact holder 3.

The conductive contact holder 3 is further described regarding its structure. The first guiding member 32 and the second guiding member 33 extend along a z axis direction (a direction perpendicular to the groove width direction and the groove depth direction), shown in FIG. 5, in parallel with each other. The guiding groove 321 extends along the z axis direction shown in FIG. 5 for a length shorter than that the guiding groove 331 extends along the same z axis direction. The guiding groove 331 reaches a bottom wall 3d of the conductive contact holder 3, while the guiding groove 321 only extends up to a position above the bottom wall 3d in the vertical direction.

Figure 5:
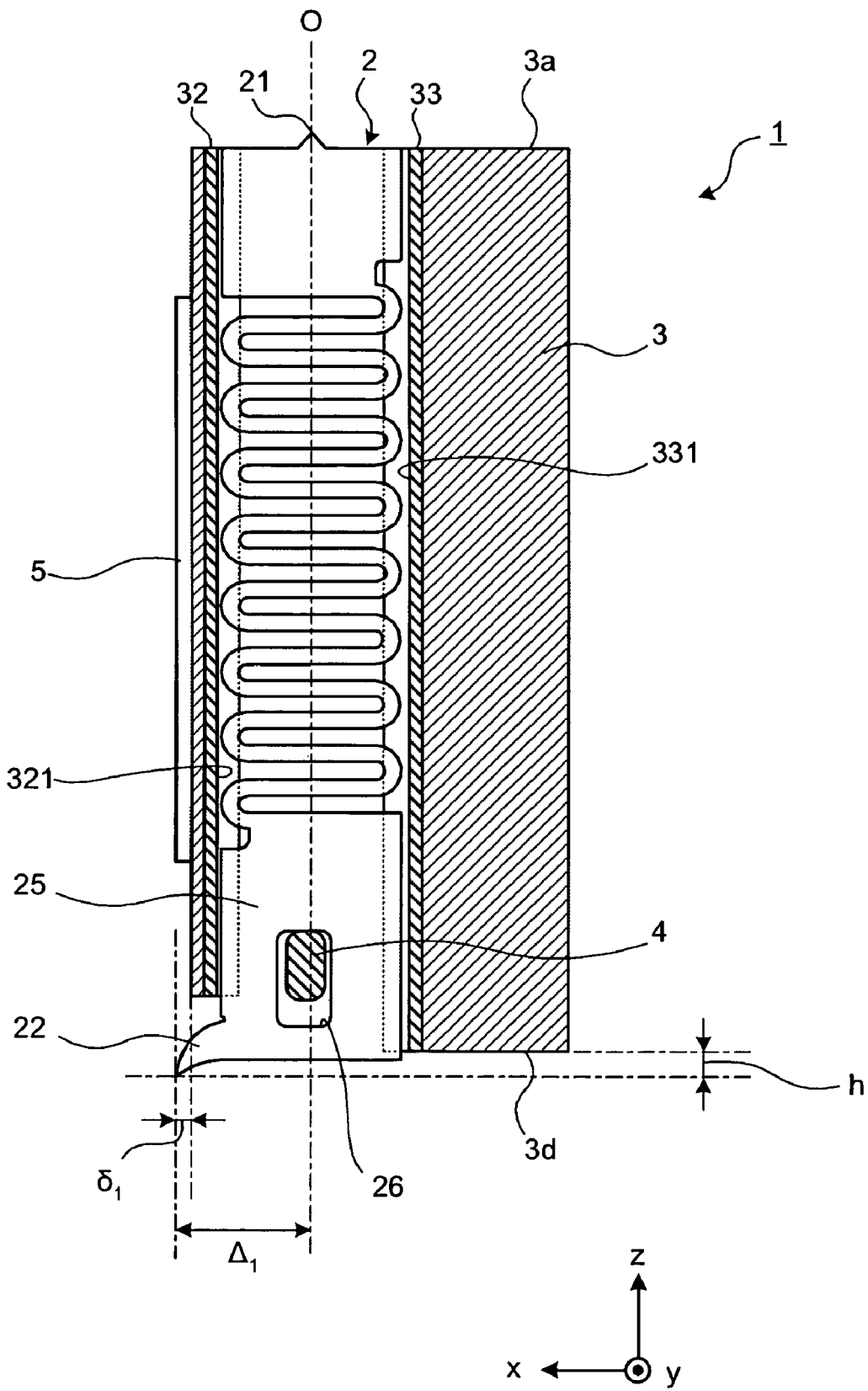
FIG. 5 is a diagram of an internal structure of the conductive contact unit according to the first embodiment.

In the conductive contact holder 3 having the above structure, a tip of the second contacting element 22 projects by a predetermined amount from the side wall 3c of the conductive contact holder 3 in the x axis direction (the projected length is denoted as "$\delta_1$") in a state applying no load to the first contacting element 21 and the second contacting element 22 (the state shown in FIG. 5). The projected length $\delta_1$ is determined based on conditions such as a size of the conductive contact 2 or the conductive contact holder 3, or the load that should be added to the test object.

In this way, by arranging the second contacting element 22 to project from the side wall 3c of the conductive contact holder 3 in the width direction, an operator can easily make an observation visually or with a microscopic from the top of the conductive contact unit during actual testing, and perform testing operations while checking physical contact between the tip of the conductive contact and the test object. Accordingly, the operator no longer needs to bend over to observe the contact between the conductive contact and the test object. This makes it possible to further improve testing workability and reliability, and reduce the operator's burden.

The tip of the second contacting element 22 projects by a predetermined amount from the bottom wall 3d in a negative direction in the z axis (the projected length is denoted as "h"). Further, the second contacting element 22 is provided at a position offset by a predetermined distance (the offset is denoted as "$\Delta_1$") from a symmetric axis O that is in parallel with the longitudinal direction of the resilient element 23 or the first connecting element 24. The projected length h and the offset $\Delta_1$, as well as the projected length $\delta_1$, are determined based on conditions such as a size of the conductive contact 2 or the conductive contact holder 3, or the load that should be added to the test object.

In the conductive contact holder 3, at least the first guiding member 32 and the second guiding member 33 that are brought into direct contact with the conductive contacts 2, are preferably formed using insulating material to prevent a short circuit. For example, the conductive contact holder 3 may be formed using a synthetic resin of low thermal expansion, and the guiding grooves 321 and the guiding grooves 331 may be formed thereon by dicing and the like. Alternatively, a base material for the conductive contact holder 3 may be formed using a ceramic such as alumina ($Al_2O_3$), zirconia ($ZrO_2$), or silica ($SiO_2$), a thermosetting resin such as a silicone, or an epoxy, an engineering plastic such as a polycarbonate or the like, and the guiding grooves 321 and the guiding grooves 331 may be formed with a processing technology such as etching.

Alternatively, instead of using an insulating material for forming the conductive contact holder 3, other appropriate materials (regardless of the insulating property of the material) also can be used to form the base material and to apply an appropriate insulating coating over the areas that could possibly contact with the conductive contacts 2 (the area including the guiding grooves 321 or the guiding grooves 331).

Both ends of the bar-shaped member 4 are inserted through the opening 26 of each of the conductive contacts 2 held between the first guiding member 32 and the second guiding member 33, then inserted into the fastening holes 34, and fixed onto the conductive contact holder 3. The bar-shaped member 4 functions to prevent the conductive contacts 2 from being disengaged from the supporting element 31, by penetrating through all of the openings 26 of the conductive contacts 2 that are held in the supporting element 31, as well as to give an initial flexure to the conductive contacts 2.

A cross section of the bar-shaped member 4, sectioned perpendicular to the longitudinal direction, has a rectangular shape with chamfered corners, and the area thereof is smaller than that of the opening 26 of the conductive contact 2. Such a cross-sectional shape enables a process, performed for forming the fastening holes 34 with respect to the conductive contacts 2, to be simplified. The above-described cross-sectional shape also enables the conductive contacts 2 to move smoothly when a load is applied to the conductive contacts 2, and ensures stability in supporting the bar-shaped member 4 when a predetermined load is applied to the conductive contacts 2. Moreover, when the test object is brought into contact with the conductive contacts 2, the opening 26 becomes separated from the bar-shaped member 4, enabling the opening 26 to move freely with respect to the bar-shaped member 4. As a result, the conductive contacts 2 can be rotated slightly, as described later.

The cross-sectional shape of the bar-shaped member 4, sectioned perpendicular to the longitudinal direction, is not limited to the above, and may be polygonal, square, or circular, for example. It should be needless to say that the shape of the fastening hole 34 varies according to the cross-sectional shape of the bar-shaped member 4.

The bar-shaped member 4 having the above structure is also formed using an insulating material. Because this bar-shaped member 4 penetrates through the openings 26 of a number of the conductive contacts 2 to support all of the conductive contacts 2, the bar-shaped member 4 is preferably made of an insulating material such as a ceramic, with high rigidity, and with small flexure generated upon application of a load.

The magnet 5 is attached to the side wall 3c such that a magnetic flux thereof passes through the conductive contacts 2 formed of a magnetic material. The magnet 5 needs to have magnetic attraction of a magnitude that allows disarray of the conductive contacts 2 within a desirable range, and that allows action of magnetic force not causing excessive friction force between the conductive contacts 2 and the guiding grooves 321 after the conductive contacts 2 are moved by the magnetic force of the magnet 5. As the magnet 5, rear earth neodymium (Ne—Fe—B) magnets are preferably used, but not limited to this. For example, under a high-temperature environment in which the external temperature exceeds 80 degrees, samarium-cobalt (Sm—Co) magnets are preferable. Further, concerning cost down, ferrite magnets are preferable.

Figure 6:
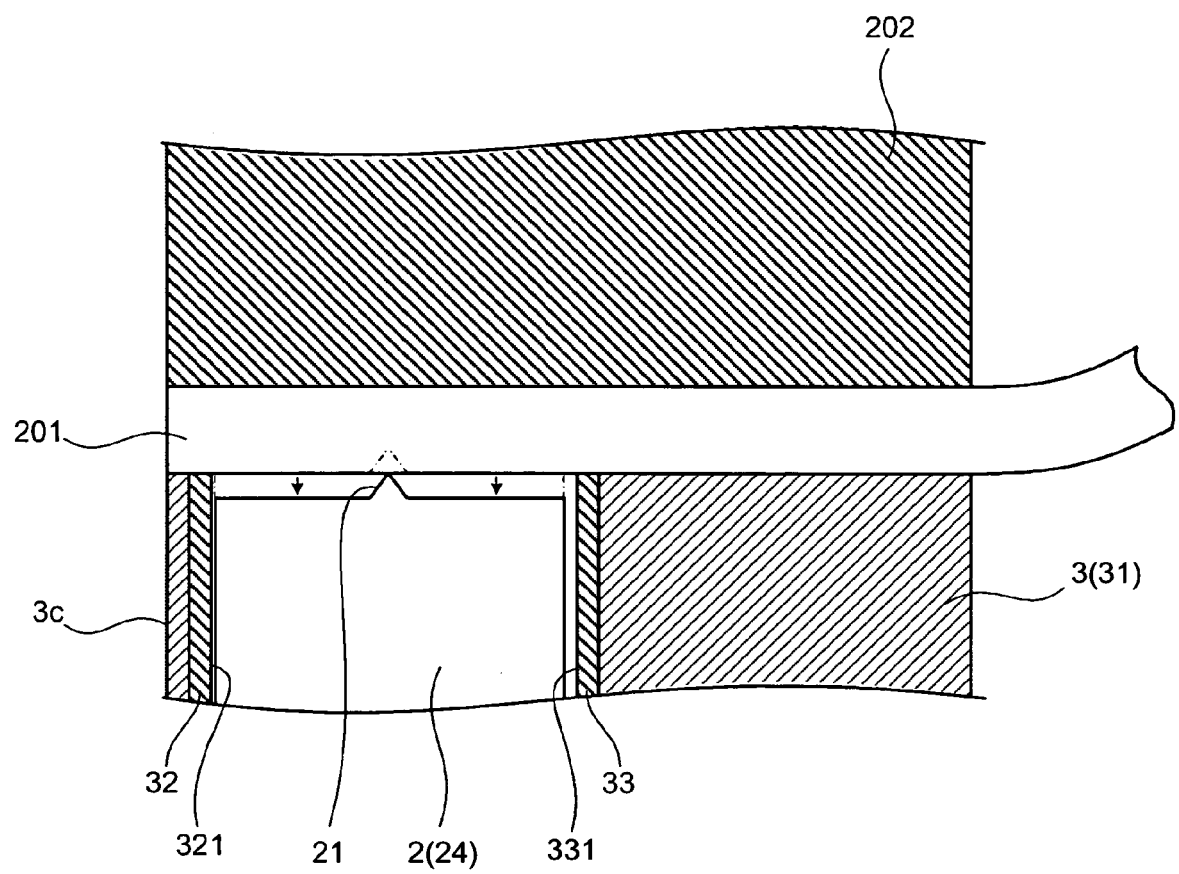
FIG. 6 is a partial enlarged view of an upper portion of the conductive contact holder attached with a circuit board that is connected to a test circuit.

FIG. 6 is a partial enlarged view of the upper portion of the conductive contact holder 3 attached with a circuit board for establishing an electrical connection with a signal processing circuit that generates and outputs a test signal. For the purpose of comparison, the position of the conductive contact 2 shown in FIG. 5 is indicated with a dotted line. A circuit board 201 shown in FIG. 6 has a plurality of wires and connecting electrodes, made of a material such as nickel, formed on one surface of the sheet-like board made of a material such as polyimide. FIG. 6 illustrates an arrangement where the electrodes of the circuit board 200 are aligned to be brought into contact with the first contacting elements 21 of the conductive contacts 2, and the circuit board 201 is held between the a fixing member 202, made of the same material as the conductive contact holder 3, and the conductive contact holder 3. To fix the circuit board 201 onto the conductive contact unit 1, the conductive contact holder 3 and the fixing member 202 may be fixed together with screws (not shown), for example. If the arrangement transits from the state shown in FIG. 5 to that shown in FIG. 6, a load (initial load), other than the gravity, acting upon the conductive contacts 2, is applied to each of the conductive contacts 2, shrinking each of the resilient elements 23 in the longitudinal direction.

The other end of the circuit board 201 is connected to the signal processing circuit (not shown) as described above, and transmits and receives an electrical signal to and from the test object that is in contact with the second contacting elements 22. In FIG. 6, the circuit board 201 is brought into contact with the conductive contacts 2. Instead, another configuration is possible where, for example, connecting terminals of a signal outputting circuit are directly brought into contact with the conductive contacts 2.

In a known conductive contact unit, a plate-like covering member has been used for applying the initial load to the conductive contacts. However, when such a covering member is used, the contacting element located at the tip of the conductive contact needed to be projected further by a distance equal to the thickness of the covering member. Thus, it has been a problem that a greater area becomes unstable when the load is applied, and the area near the tip could become bent easily. Because the conductive contact unit 1 according to the first embodiment does not use the covering member, the problem is no longer occurring, and the size of the first contacting element 21 can be dramatically reduced in comparison with the known example.

Figures 1, 7:
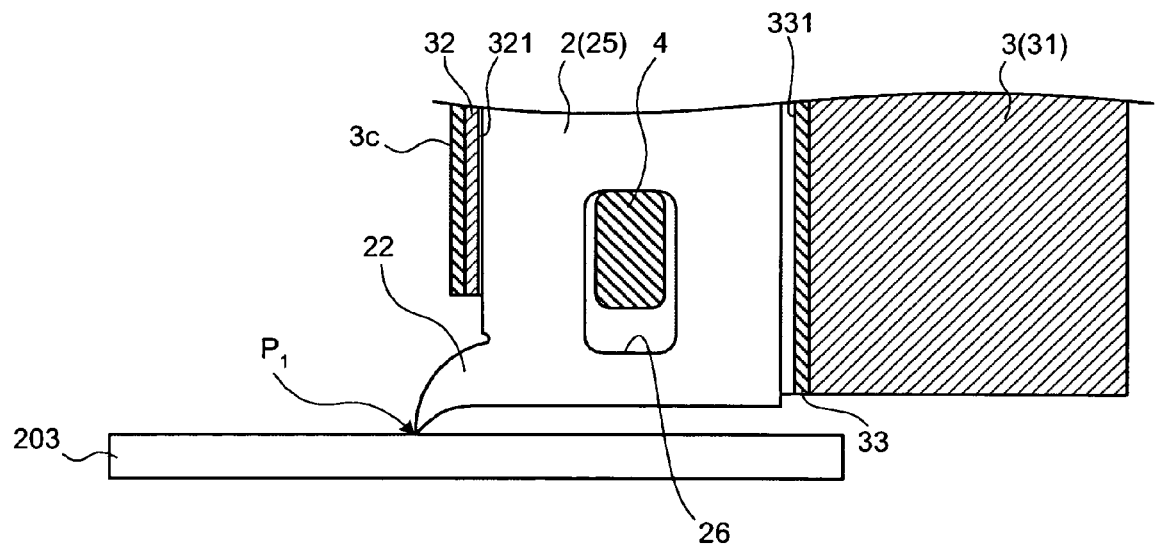
Figures 2, 7:
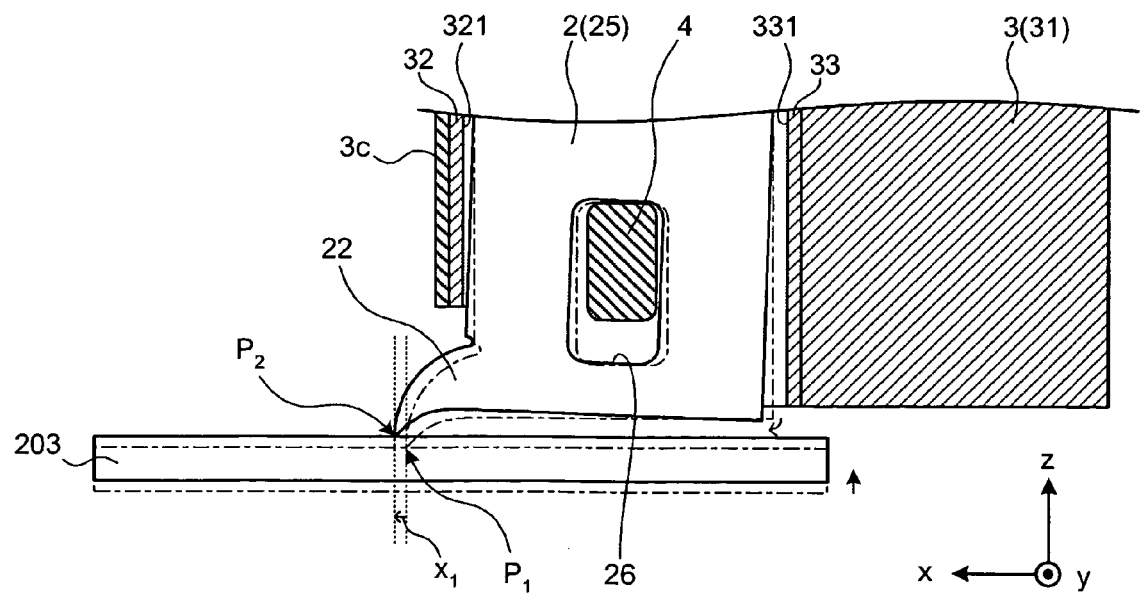

Described below is an illustrative embodiment of a contact between conductive contact unit 1 and the test object. FIG. 7-1 is a diagram of an area near the bottom end of the conductive contact 2 immediately after a test object 203 is brought into contact with the second contacting elements 22 of the conductive contacts 2. FIG. 7-2 is a diagram of the area near the bottom end of the conductive contact 2 when the test object 203 is elevated to a test position. In FIG. 7-2, the position of the conductive contact 2 immediately after the contact is established is shown in dotted line for the purpose of comparison.

The tip of the second contacting element 22 is offset by $\Delta_1$ from the longitudinal symmetric axis (central axis) O of the resilient element 23 or the first connecting element 24, as described above with reference to FIG. 5. Therefore, the line of action of the load acting upon the tip of the second contacting element 22 that is brought into contact with the test object 203 does not go through the center of gravity of the conductive contact 2. Thus, a moment is generated in the conductive contact 2. As a result, the resilient element 23 shrinks and the opening 26 is moved away from the bar-shaped member 4. Due to this moment, the conductive contact 2 rotates slightly, while the conductive contact 2 goes through the transition from the state shown in FIG. 7-1 to that shown in FIG. 7-2. This rotation is generated because a small gap is present between the edge of the resilient element 23 and the guiding groove 321, and the other edge thereof and the guiding groove 331, respectively, in the width direction.

Due to this rotation, the second contacting element 22 slightly rotates clockwise in FIG. 7-2, and moves along the surface of the test object 203 while keeping in contact with the test object 203. More specifically, the tip of the second contacting element 22 slides from an initial contact point $P_1$ to a final contacting point $P_2$, scratching the surface of the test object 203, to move in the x axis direction by a distance of $x_1$ (>0). In this manner, while the tip of the second contacting element 22 is moved on the surface of the test object 203, the oxidized film or dust accumulated to the surface thereof is removed, ensuring a stable electrical contact between the second contacting elements 22 and the test object 203. This is advantageous because, if the movement speed (elevating speed) of the test object 203 is controlled appropriately at this time, not only the surface of the test object 203 can be protected from being damaged greatly by the tips of the second contacting elements 22, but also the conductive contacts 2 can be prevented from being applied with an excessive load.

The conductive contact unit 1 holds the conductive contacts 2 by engaging parts of the conductive contacts 2 into the guiding grooves 321 and the guiding grooves 331 laid in the direction that the resilient element 23 of the conductive contacts 2 is extensible. Therefore, a problem of buckling or twisting due to the shrinkage of the resilient element 23, which is a problem unique to the plate-like conductive contact 2, can be prevented from occurring. Furthermore, the spring characteristic of the resilient element 23 can be prevented from deteriorating due to the problem such as above. In this manner, a large stroke can be achieved without causing buckling or twisting, even when a certain or more load within an appropriate range is applied to the conductive contact 2, and a desirable contact can be obtained between the second contacting elements 22 and the test object 203.

Moreover, in the conductive contact unit 1, the conductive contacts 2 are held by the guiding grooves 321 and the guiding grooves 331. Therefore, it is possible to reduce a sliding resistance by reducing the area of the conductive contact 2 being in contact with the conductive contact holder 3, enabling the conductive contacts 2 to be extended smoothly.

Furthermore, in the conductive contact unit 1, it is sufficient if the groove width (w) of the guiding grooves 321 and the guiding grooves 331 is approximately the same as the thickness of the conductive contacts 2. Moreover, each of the intervals between the adjacent guiding grooves 321 or the adjacent guiding grooves 331 can be reduced to a given small value, as long as the insulation between the adjacent conductive contacts 2 is ensured. Therefore, it is possible to reduce the arrangement intervals between the conductive contacts 2, and to support the small arrangement intervals between the connecting electrodes or terminals of the contacted circuitries.

In addition, in the conductive contact unit 1, the bar-shaped member 4 penetrates to give the initial flexure onto the conductive contacts 2, as well as to prevent the conductive contacts 2 from being disengaged. As a result, it is possible to reduce the distance h of the tip of the second contacting element 22, that is, the lower end of the conductive contact 2 projecting in the vertical direction below the bottom wall 3d of the conductive contact holder 3. In other words, the size of the second contacting element 22 can be reduced, and the tip of the conductive contact 2 can be prevented from being bent, and the conductive contact 2 can be supported in a stable manner. Thus, the conductive contacts 2 can be prevented from being disengaged from the guiding grooves 321 and/or the guiding grooves 331 near the bottom area thereof. As a result, positional accuracy of the tip of conductive contacts 2 can be improved, and reliability and durability of the conductive contact unit 1 can be also improved.

Figure 8:
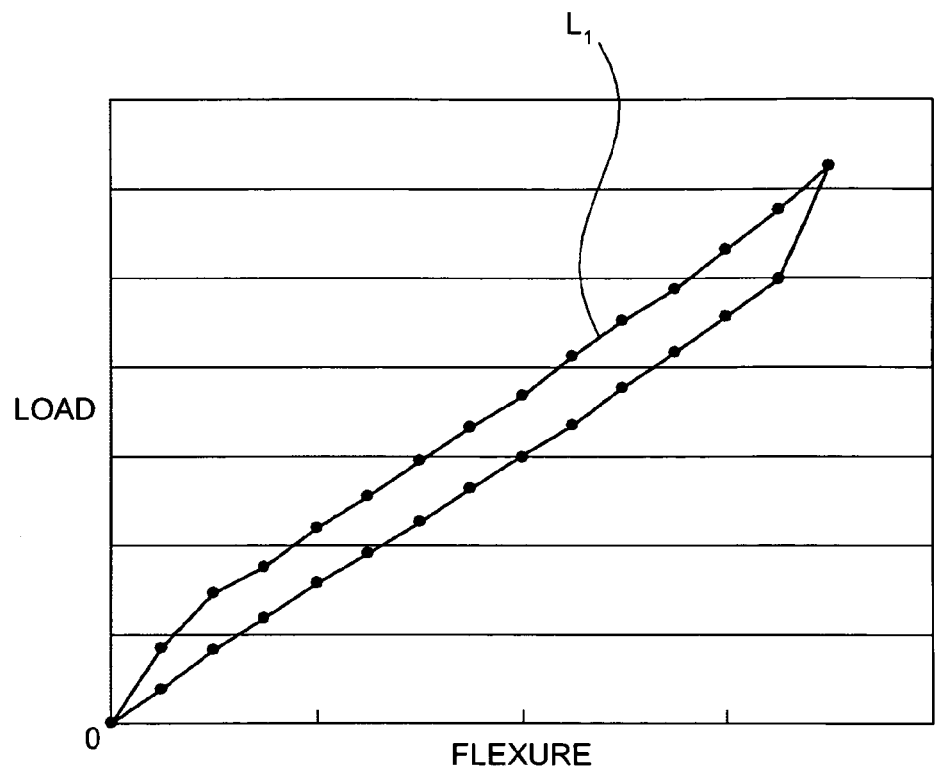
FIG. 8 is a chart of flexure-load characteristics of the conductive contacts in the conductive contact unit according to the first embodiment of the present invention.
Figure 9:
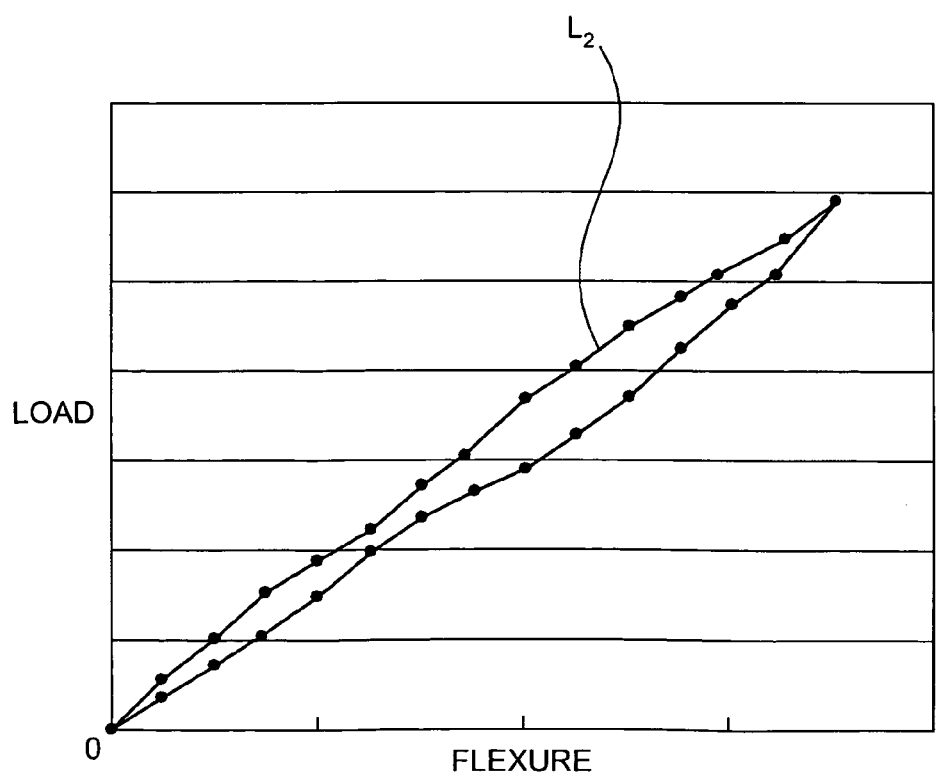
FIG. 9 is a chart of flexure-load characteristics of the conductive contacts in the conductive contact unit with no magnet.
Figure 10:
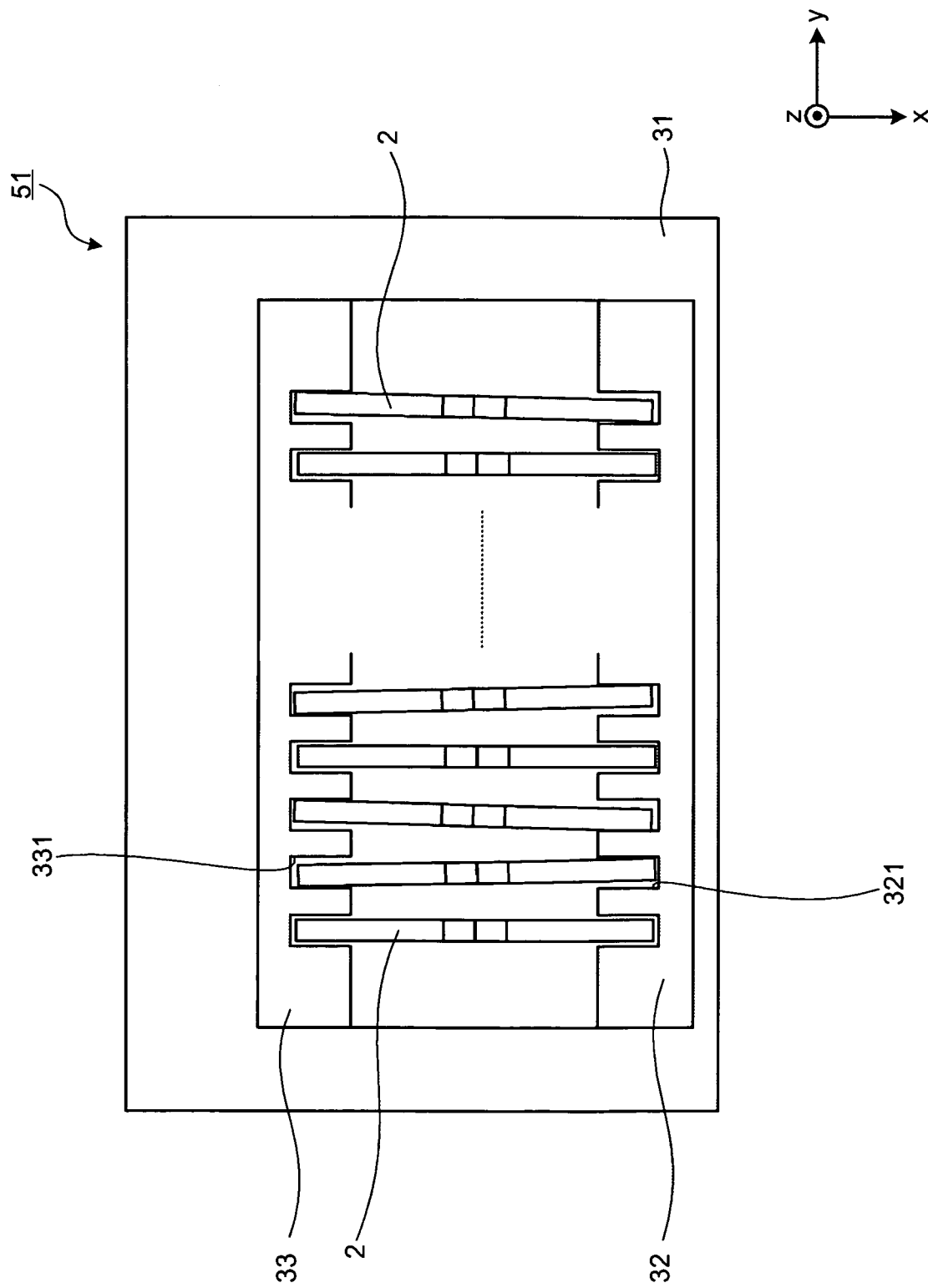
FIG. 10 is a diagram of a structure of the conductive contact unit with no magnet.

FIG. 8 is a chart of an exemplary relationship (flexure-load characteristics) between the flexure and the load of the conductive contacts 2 in the conductive contact unit 1. FIG. 9 is a chart of an example of flexure-load characteristics of the conductive contacts 2 in a conductive contact unit 51 with no magnet 5 (having the same structure as the above, except the magnet 5). In the conductive contact unit 51 with no magnet 5, the conductive contacts 2 are held in disarray in the conductive contact holder 3, as shown in FIG. 10.

In comparison between characteristic curves $L_1$ shown in FIG. 8 and characteristic curves $L_2$ shown in FIG. 9, the difference in characteristics (hysteresis) between the compressed state and the elongated state of the conductive contacts 2 is larger when the magnet 5 is attached to the conductive contact holder 3. However, the linearity between the flexure and the load is improved. Further, the variation in loads occurred in the respective conductive contacts 2 accommodated or held in the same conductive contact holder is small. The variation is defined as $(D_1+D_2)/2$, where a difference between a maximum load value and a minimum load value to be applied to the conductive contacts 2 in the compressed state is $D_1$, and a difference between a maximum load value and a minimum load value to be applied to the conductive contacts 2 in the elongated state is $D_2$. A value of a variation when the magnet 5 is attached is about 40% of that when no magnet 5 is attached. As a result, a test signal can be stably supplied to the test board. The comparison is made between two arrangements (an arrangement with the magnet 5 attached and an arrangement with no magnet 5 attached), using a load value that allows a predetermined amount of flexure, and the same number of conductive contacts 2 for finding the variation.

As described above, in the conductive contact unit 1 according to the first embodiment, the variation in loads occurred in the conductive contacts 2 is smaller than in that of the conventional technologies, so that a stable test signal can be supplied to the test object 203. Such an advantage is increased by realizing narrower pitch of the test object 203.

Figure 11:
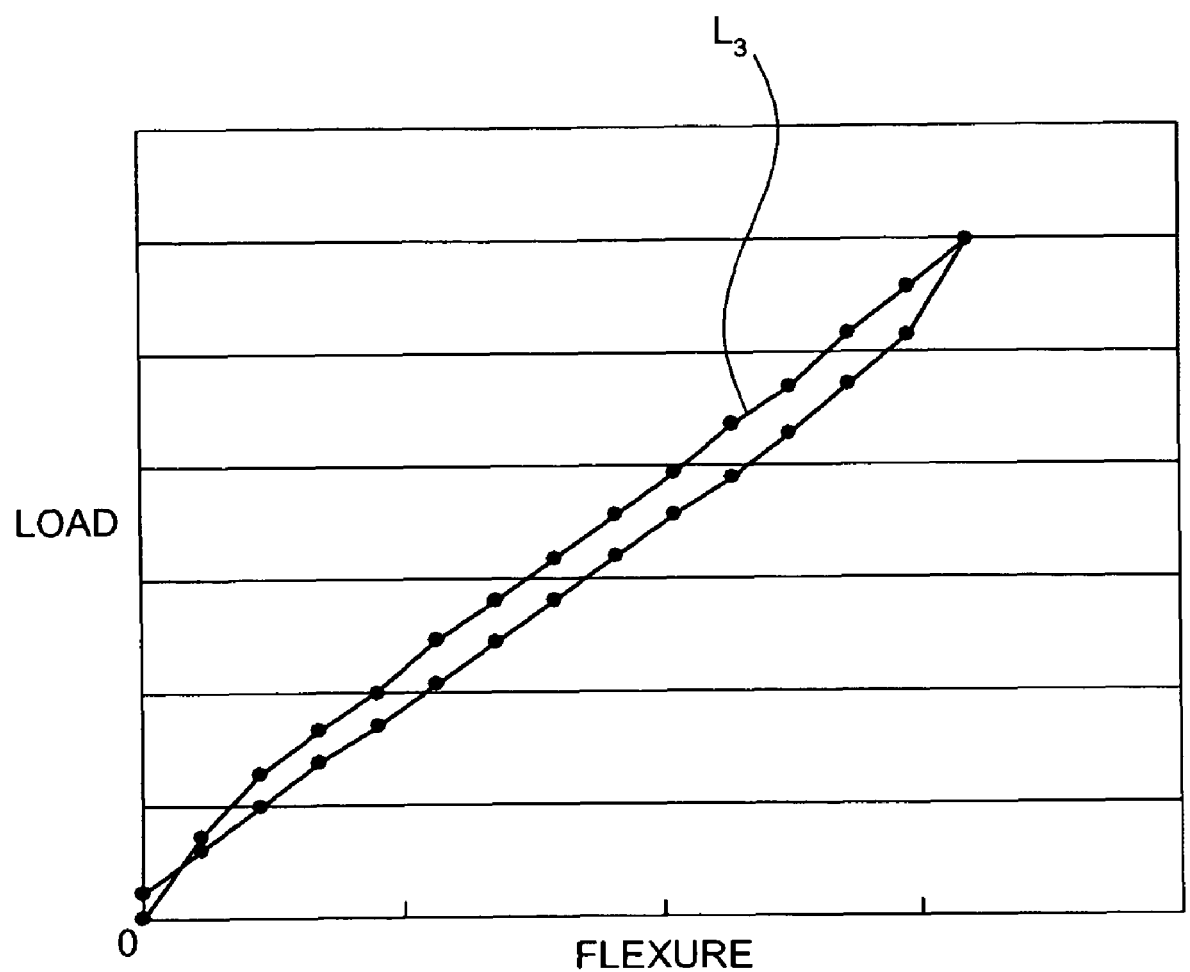
FIG. 11 is a chart of flexure-load characteristics of conductive contacts in a conductive contact unit according to a modification of the first embodiment of the present invention.

The magnet 5 may be attached to the side wall 3b, not to the side wall 3c. FIG. 11 is a chart of an example of flexure-load characteristics of the conductive contacts 2 in this arrangement. Characteristic curves $L_3$ shown in FIG. 11 also have improved linearity than the characteristic curves $L_2$ shown in FIG. 9. Further, in this arrangement, the variation in loads occurring in the respective conductive contacts 2 is about 60% of the example of the conventional technologies, when comparison is made under the same conditions as the above. Because of the shape of the conductive contact holder 3, the variation is reduced less than in the arrangement with the magnet 5 attached to the side wall 3c. Specifically, attaching the magnet 5 to the side wall 3c facilitates functioning of the conductive contact holder 3 as the aligning unit.

For example, when the magnet 5 is provided to the side wall 3c, however, it becomes difficult for an operator to visually check the contact state between the tip of the second contacting element 22 and the test object 203. As such, when attachment of the magnet 5 to the side wall 3c causes any inconvenience due to the shape of the conductive contact holder 3, the magnet may be attached to the side wall 3b to ensure a desirable aligning effect. In this sense, an attachment position of the magnet 5 as the aligning unit may be any position that allows the magnet 5 to have a magnetic flux passing through the conductive contacts 2 and to function as the aligning unit. The attachment position may be changed appropriately depending on the shape of the conductive contacts 2 and/or the conductive contact holder 3 or other factors.

According to the first embodiment of the present invention, a conductive contact holder has a plurality of first guiding grooves and a plurality of second guiding grooves facing the first guiding grooves. The first guiding grooves engage one edges in a width direction of conductive contacts to hold them in a slidable manner, respectively, and the second guiding grooves engage other edges than those engaging the first guiding grooves to hold them in a slidable manner, respectively. The plurality of plate-like conductive contacts, each of which includes a first contacting element that is brought into physical contact with one of different circuitries, a second contacting element that is brought into physical contact with one of the different circuitries other than that brought into contact with the first contacting element, an resilient element that is interposed between the first contacting element and the second contacting element and is extensible in a longitudinal direction thereof, a first connecting element that connects the resilient element and the first contacting element, and a second connecting element that connects the resilient element and the second contacting element. An aligning unit that aligns the conductive contacts. This makes it possible to reduce variation in friction force generated between the conductive contacts and the guides, and to supply a test signal stably.

Instead of using a magnet as the aligning unit, an electromagnet constituted by a coil or the like may be used. In this case, a magnetic flux can be controlled as necessary, in addition to the above advantages. Thus, by turning off a switch of the circuit to finish the test, it becomes possible to reduce friction force occurring when the conductive contacts 2 are elongated, and to further reduce variation in the conductive contacts. Further, improved repeatability is achieved for each of the conductive contacts returning to the position before being compressed.

Second Embodiment

Figure 12:
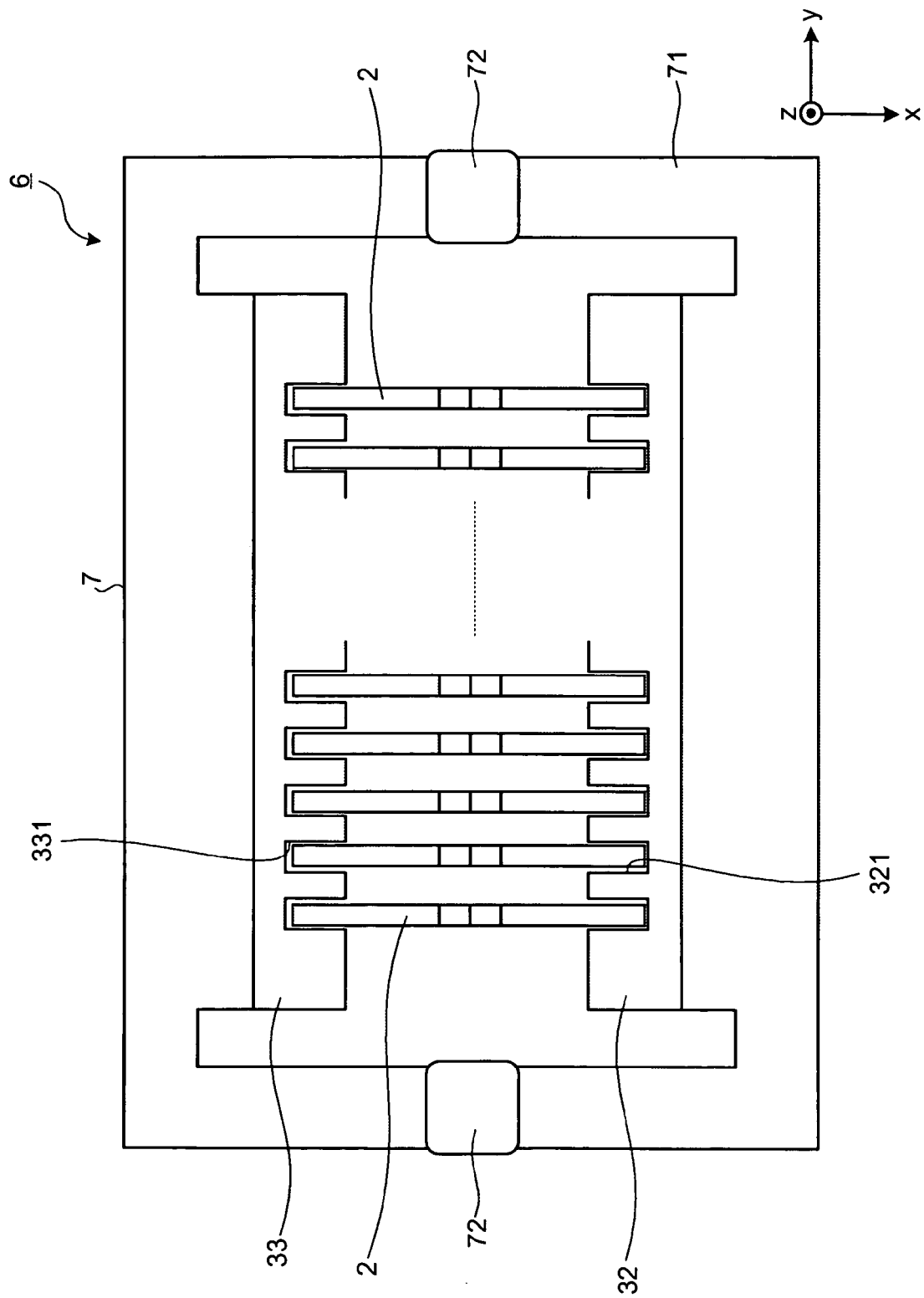
FIG. 12 is a top view of a structure of a conductive contact unit according to a second embodiment of the present invention.

FIG. 12 is a top view of a structure of a conductive contact unit according to a second embodiment of the present invention. A conductive contact unit 6 shown in FIG. 12 includes the conductive contacts 2 and a conductive contact holder 7. The conductive contact holder 7 includes: a supporting element 71 having an approximately cubic shape with a hollow portion; the first guiding member 32 (including the guiding grooves 321) and the second guiding member 33 (including the guiding grooves 331), both attached to the hollow portion of the supporting element 71 to face each other, for guiding the conductive contacts 2; and fastening holes (not shown), formed at predetermined positions on the respective side walls 3b facing each other with the supporting element 71 in between, for fastening ends of the bar-shaped member 4.

The supporting element 71 is formed of a magnetic material (york). On both side walls of the supporting element 71 in the y axis direction, two bar-like magnets 72 are embedded. The magnets 72 and the supporting element 71 constitute a magnetic circuit. The magnetic circuit enables the conductive contacts 2 to be aligned as in the first embodiment. Thus, the supporting element 71 and the magnets 72 serve as an aligning unit.

The conductive contact holder 7 has clearance between the side walls, being in parallel with the x axis direction, of the first guiding member 32 and the second guiding member 33, and the supporting element 71. The clearance is provided so that a magnetic flux of the magnetic circuit, constituted by the supporting element 71 and the two magnets 72, passes through the each of conductive contacts 2. In the x direction, the clearance portions have a length that is greater than a width of the hollow portion of the supporting element 71 in the x axis direction, in an area between the first guiding member 32 and the second guiding member 33 facing each other. Further, both ends of the clearance portions in the x axis direction project in +x direction and −x direction, respectively, from both ends of the hollow portion of the supporting element 71 in the x axis direction, in the area between the first guiding member 32 and the second guiding member 33 facing each other. The shape of such clearance portions is decided appropriately based on the shapes and the materials of the supporting element 71 and the magnets 72 or other factors.

According to the second embodiment of the present invention, the same effect can be achieved as in the first embodiment. In addition, the second embodiment has an advantage as having an increased flexibility for the attachment position of a magnet constituting part of the aligning unit.

Third Embodiment

Figure 13:
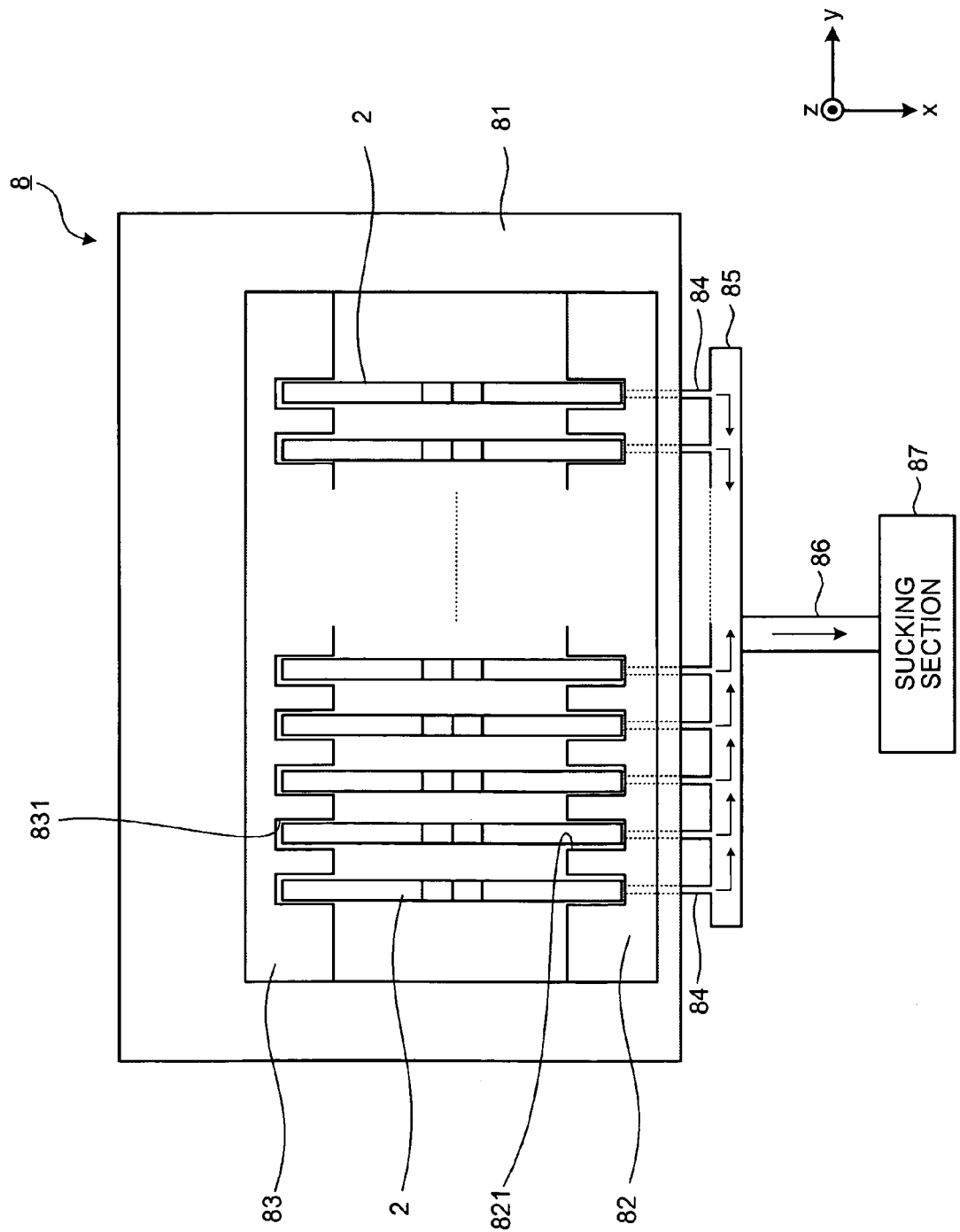
FIG. 13 is a top view of a structure of a conductive contact unit according to a third embodiment of the present invention.

FIG. 13 is a top view of a structure of a conductive contact unit according to a third embodiment of the present invention. In a conductive contact unit 8 shown in FIG. 13, through-holes are provided that penetrate through a supporting element 81 and each of guiding grooves 821 of a first guiding member 82. Further, flow paths 84, formed in narrow tubes, are inserted to the through-holes. The flow paths 84 communicating to each of the guiding grooves 821 are communicated to one another, to constitute a large flow path 85. The flow paths 84 are connected to a sucking section 87 including a vacuum pump or the like via a coupling section 86 constituted by a hose or the like. The sucking section 87 serves to suck air upon application of negative pressure. Being sucked, the conductive contacts 2 are pulled away from the side of guiding grooves 831 of a second guiding member 83 toward the side of the guiding grooves 821 of the first guiding member 82, to be uniformly aligned as shown in FIG. 13. In this sense, the sucking section 87 has functions as the aligning unit that aligns the conductive contacts 2.

In the third embodiment, because a magnet is not used as the aligning unit, the conductive contacts 2 need not be formed of a material including a magnetic material.

According to the third embodiment of the present invention, the same effect can be achieved as in the first embodiment.

Fourth Embodiment

Figure 14:
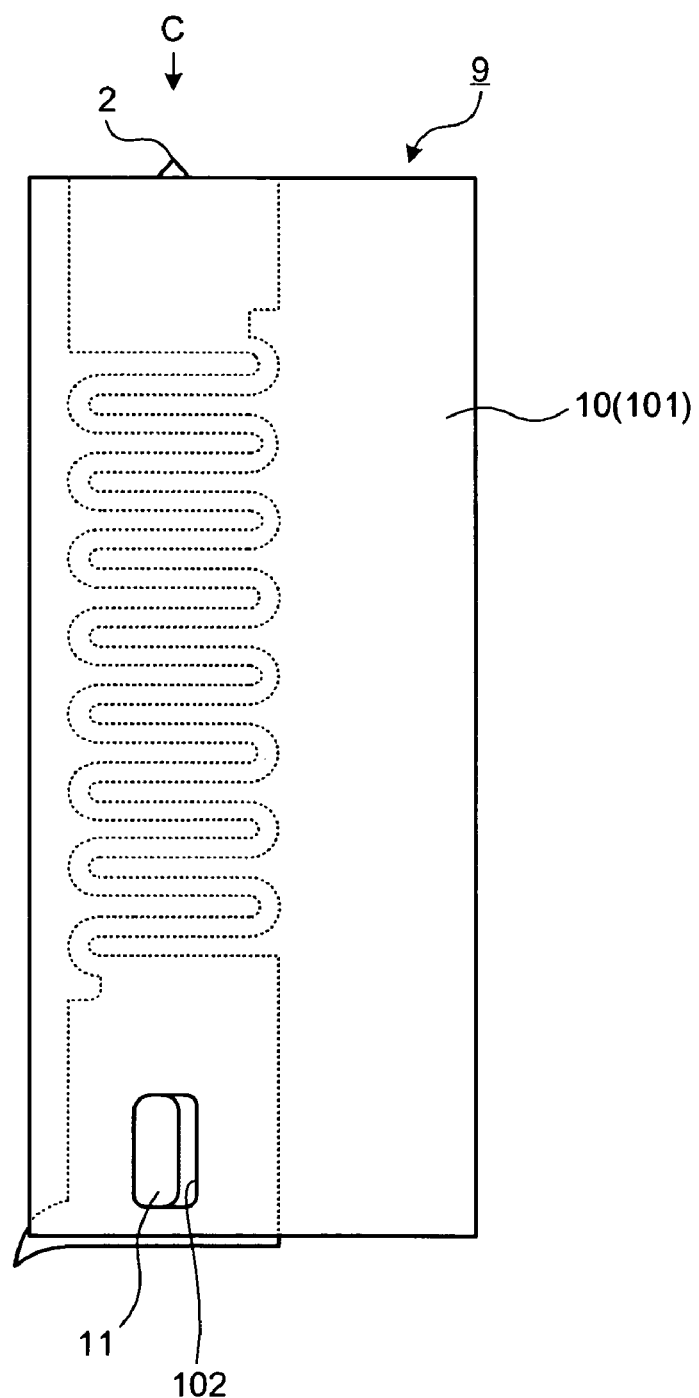
FIG. 14 is a top view of a structure of a conductive contact unit according to a fourth embodiment of the present invention.
Figure 15:
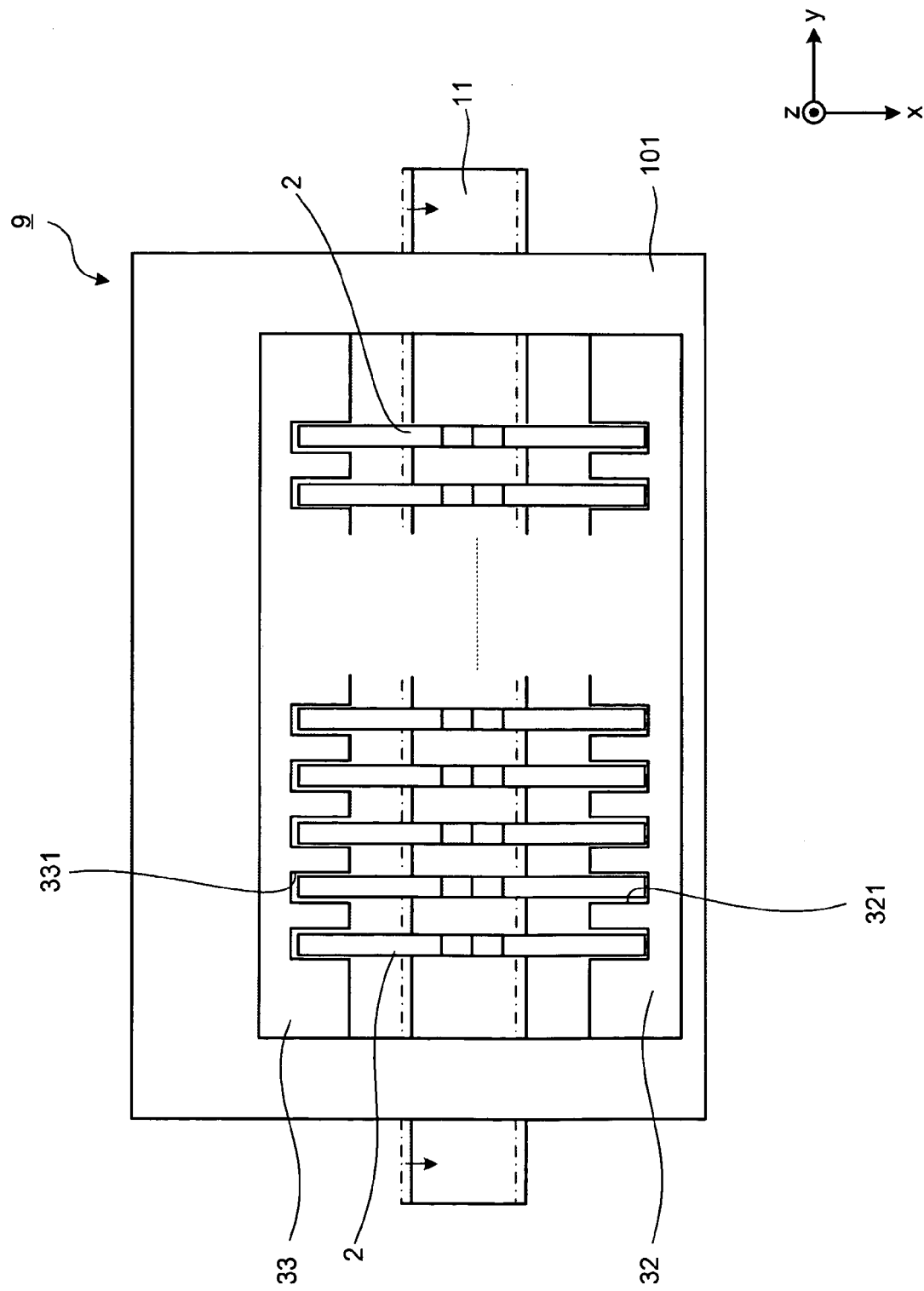
FIG. 15 is a view in a direction indicated by an arrow C shown in FIG. 14.

FIG. 14 is a side view of a structure of a conductive contact unit according to a fourth embodiment of the present invention. FIG. 15 is a top view from a direction C shown in FIG. 14. In a conductive contact unit 9 shown in FIGS. 14 and 15, a bar-shaped member 11 penetrating through the conductive contacts 2 and a conductive contact holder 10 can slightly move relative to a supporting element 101 of the conductive contact holder 10. This is realized by arranging fastening holes 102, formed in the supporting element 101, to have a size slightly larger than a size of the bar-shaped member 11 in the x axis direction. In FIG. 15, constituting element with the same reference numerals as those of the first embodiment have the same functions as those of the first embodiment.

In the fourth embodiment, by moving the bar-shaped member 11 to be pushed toward the first guiding member 32, the conductive contacts 2 are aligned. In this sense, the bar-shaped member 11 serves as an aligning unit for the conductive contacts 2.

After alignment of the conductive contacts 2, the position of the bar-shaped member 11 relative to the supporting element 101 may be fixed using appropriate position fixing means, for example, screws. Further, by forming an opening in the first connecting element 24, as well as in the second connecting element 25, and providing a bar-shaped member to penetrate through this opening, the conductive contacts 2 may be aligned with the bar-shaped members at two positions: the upper and the lower positions in the longitudinal direction (z direction shown in FIG. 15).

In the fourth embodiment, because a magnet is not used as the aligning unit, the conductive contacts 2 need not be formed of a material including a magnetic material.

According to the fourth embodiment of the present invention, the same effect can be achieved as in the first embodiment.

Figures 1, 16:
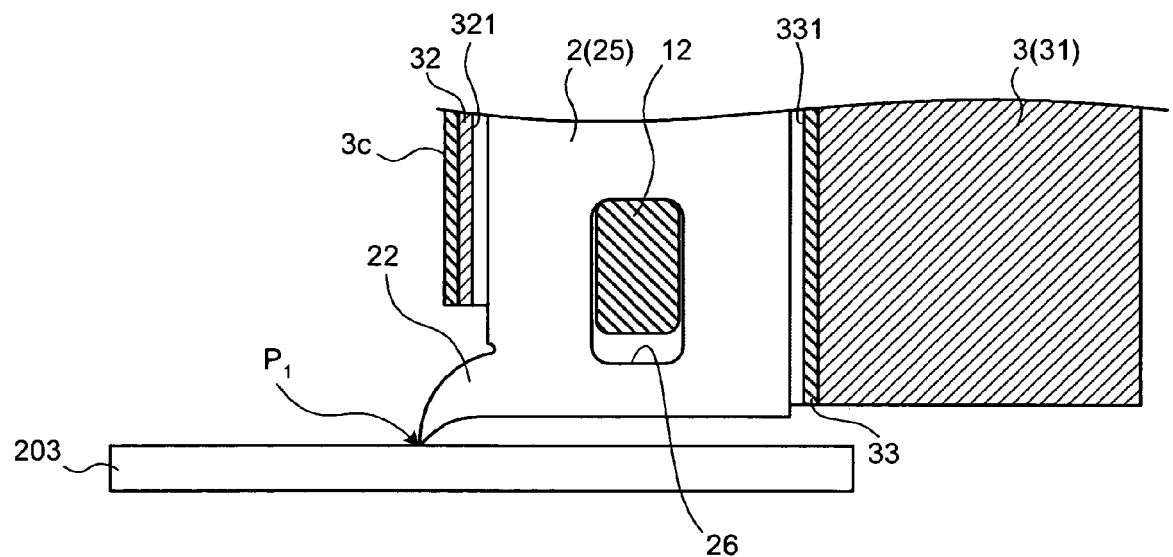
Figures 2, 16:
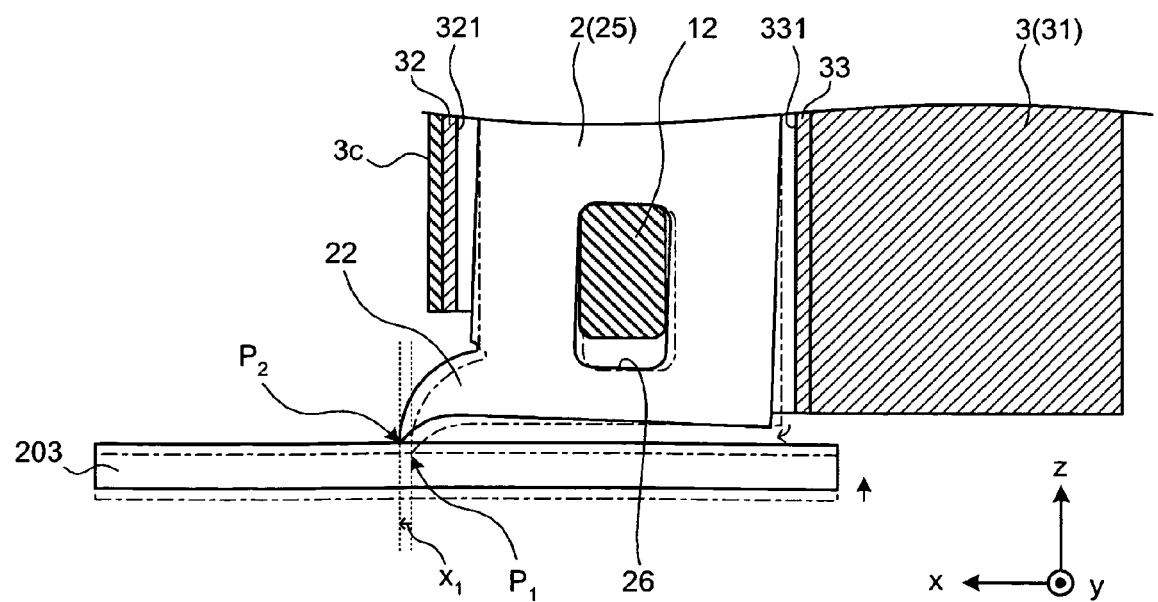

FIGS. 16-1 and 16-2 are diagrams of a structure of relevant portions of a conductive contact unit according to a modification of the fourth embodiment. FIG. 16-1 is a diagram of an area near the bottom end of the conductive contact 2 immediately after the test object 203 is brought into contact with the second contacting element 22 of the conductive contact 2. FIG. 16-2 is a diagram of the area near the bottom end of the conductive contact 22 when the test object 203 is elevated to a test position.

In the arrangements shown in FIGS. 16-1 and 16-2, a width-direction size of the bar-shaped member 12 is slightly smaller than a width of the opening 26 of the conductive contact 2 in the width direction. Accordingly, when the test object 203 is elevated to the test position (FIG. 16-2), the conductive contacts 2 are aligned, being rotated to come in contact with longitudinal portions of the opening 26, while being out of contact with the guiding grooves 321 and 331. Thus, in the present modification, it is not necessary to move the bar-shaped member 12 to be pushed toward the first guiding member 32.

Other Embodiments

The first to fourth embodiments are described above in detail as best mode for carrying out the present invention. However, the present invention is not intended to be limited only to these four embodiments. For example, the shape of the second contacting element of the conductive contact should be decided depending on various conditions, such as the material used for the conductive contacts, the shape of the conductive contact holder that accommodates and holds the conductive contacts, the load that should be applied to the conductive contact holder, and a type of the test object. The detailed shape of the second contacting element may be modified appropriately as long as it has the technical characteristics of the present invention.

Moreover, in addition to the test of the liquid crystal panel, the conductive contact unit according to embodiments of the present invention can also be applied to a test of a package board mounted with a semiconductor chip, or a high density probe unit used for performing a wafer-level test.

As described above, the present invention may include various embodiments that are not described herein, and is susceptible to various design changes or modifications and the like within the scope of the technological concept defined by the claims.

INDUSTRIAL APPLICABILITY

The conductive contact unit according to embodiments of the present invention are useful for testing the conducting state and operating characteristics of an electronic component such as a liquid crystal panel or a semiconductor integrated circuit.

The invention claimed is:

1. A conductive contact unit that establishes an electrical connection between different circuitries, and includes a plurality of conductive contacts for receiving and outputting an electrical signal from and to the circuitries, the conductive contact unit comprising:
   a conductive contact holder that includes
      a plurality of first guiding grooves each slidably engaging one edge in a width direction of one of the conductive contacts to hold the conductive contact; and
      a plurality of second guiding grooves each located opposite to corresponding one of the first guiding grooves, and slidably engaging another edge of the conductive contact than the one the corresponding first guiding groove engages to hold the conductive contact;
   the conductive contacts, each of which has a plate-like shape, and includes
      a first contacting element that is brought into physical contact with one of the different circuitries;
      a second contacting element that is brought into physical contact with one of the different circuitries other than the one the first contacting element is brought into contact with;
      a resilient element that is interposed between the first contacting element and the second contacting element, and is expandable and contractible in a longitudinal direction;
      a first connecting element that connects the resilient element and the first contacting element; and
      a second connecting element that connects the resilient element and the second contacting element; and
   an aligning unit configured to bring each of the conductive contacts accommodated in the conductive contact holder into contact with an inner surface of at least one of the first guiding groove and the second guiding groove so as to align the plurality of conductive contacts in the width direction.

2. The conductive contact unit according to claim 1, wherein, one edge in the width direction of the conductive contacts aligned by the aligning unit is in contact with corresponding one of the first guiding grooves or corresponding one of the second guiding grooves.

3. The conductive contact unit according to claim 1, wherein
   at least one of the first connecting element and the second connecting element includes an opening penetrating therethrough in a through-thickness direction, and
   the aligning unit includes a bar-shaped member that penetrates through the opening of each of the conductive contacts held in the conductive contact holder, and that moves the conductive contacts together relative to the conductive contact holder at one time.

4. The conductive contact unit according to claim 1, wherein at least a portion of the second contacting element projects from an external surface of the conductive contact holder, inside which the guiding grooves are formed, in a normal direction of the external surface.

5. A conductive contact unit that establishes an electrical connection between different circuitries, and includes a plurality of conductive contacts for receiving and outputting an electrical signal from and to the circuitries, the conductive contact unit comprising:
   a conductive contact holder that includes
      a plurality of first guiding grooves each slidably engaging one edge in a width direction of one of the conductive contacts to hold the conductive contact; and
      a plurality of second guiding grooves each located opposite to corresponding one of the first guiding grooves, and slidably engaging another edge of the conductive contact than the one the corresponding first guiding groove engages to hold the conductive contact;
   the conductive contacts, each of which has a plate-like shape, and includes
      a first contacting element that is brought into physical contact with one of the different circuitries;
      a second contacting element that is brought into physical contact with one of the different circuitries other than the one the first contacting element is brought into contact with;
      a resilient element that is interposed between the first contacting element and the second contacting element, and is expandable and contractible in a longitudinal direction;
      a first connecting element that connects the resilient element and the first contacting element; and
      a second connecting element that connects the resilient element and the second contacting element; and
   an aligning unit that aligns the conductive contacts, wherein, one edge in the width direction of the conductive contacts aligned by the aligning unit is in contact with neither corresponding one of the first guiding grooves nor corresponding one of the second guiding grooves.

6. The conductive contact unit according to claim 5, wherein at least a portion of the second contacting element projects from an external surface of the conductive contact holder, inside which the guiding grooves are formed, in a normal direction of the external surface.

7. A conductive contact unit that establishes an electrical connection between different circuitries, and includes a plurality of conductive contacts for receiving and outputting an electrical signal from and to the circuitries, the conductive contact unit comprising:
   a conductive contact holder that includes
      a plurality of first guiding grooves each slidably engaging one edge in a width direction of one of the conductive contacts to hold the conductive contact; and
      a plurality of second guiding grooves each located opposite to corresponding one of the first guiding grooves, and slidably engaging another edge of the conductive contact than the one the corresponding first guiding groove engages to hold the conductive contact;
   the conductive contacts, each of which has a plate-like shape, and includes
      a first contacting element that is brought into physical contact with one of the different circuitries;
      a second contacting element that is brought into physical contact with one of the different circuitries other than the one the first contacting element is brought into contact with;
      a resilient element that is interposed between the first contacting element and the second contacting element, and is expandable and contractible in a longitudinal direction;
      a first connecting element that connects the resilient element and the first contacting element; and
      a second connecting element that connects the resilient element and the second contacting element; and
   an aligning unit that aligns the conductive contacts, wherein
   the conductive contacts include a magnetic material, and
   the aligning unit includes a magnet attached to a side wall of the conductive contact holder.

8. The conductive contact unit according to claim 7, wherein the magnet is an electromagnet.

9. The conductive contact unit according to claim 7, wherein at least a portion of the second contacting element projects from an external surface of the conductive contact holder, inside which the guiding grooves are formed, in a normal direction of the external surface.

10. A conductive contact unit that establishes an electrical connection between different circuitries, and includes a plurality of conductive contacts for receiving and outputting an electrical signal from and to the circuitries, the conductive contact unit comprising:
    a conductive contact holder that includes
       a plurality of first guiding grooves each slidably engaging one edge in a width direction of one of the conductive contacts to hold the conductive contact; and
       a plurality of second guiding grooves each located opposite to corresponding one of the first guiding grooves, and slidably engaging another edge of the conductive contact than the one the corresponding first guiding groove engages to hold the conductive contact;
    the conductive contacts, each of which has a plate-like shape, and includes
       a first contacting element that is brought into physical contact with one of the different circuitries;
       a second contacting element that is brought into physical contact with one of the different circuitries other than the one the first contacting element is brought into contact with;
       a resilient element that is interposed between the first contacting element and the second contacting element, and is expandable and contractible in a longitudinal direction;
       a first connecting element that connects the resilient element and the first contacting element; and
       a second connecting element that connects the resilient element and the second contacting element; and
    an aligning unit that aligns the conductive contacts, wherein
    the conductive contacts include a magnetic material, and
    the aligning unit includes
       a supporting element that supports the first guide grooves and the second guide grooves; and
       a magnet that is embedded in the supporting element, and that constitutes a magnetic circuit with the conductive contact holder.

11. The conductive contact unit according to claim 10, wherein the magnet is an electromagnet.

12. The conductive contact unit according to claim 10, wherein at least a portion of the second contacting element projects from an external surface of the conductive contact holder, inside which the guiding grooves are formed, in a normal direction of the external surface.

13. A conductive contact unit that establishes an electrical connection between different circuitries, and includes a plurality of conductive contacts for receiving and outputting an electrical signal from and to the circuitries, the conductive contact unit comprising:

a conductive contact holder that includes
- a plurality of first guiding grooves each slidably engaging one edge in a width direction of one of the conductive contacts to hold the conductive contact; and
- a plurality of second guiding grooves each located opposite to corresponding one of the first guiding grooves, and slidably engaging another edge of the conductive contact than the one the corresponding first guiding groove engages to hold the conductive contact;

the conductive contacts, each of which has a plate-like shape, and includes
- a first contacting element that is brought into physical contact with one of the different circuitries;
- a second contacting element that is brought into physical contact with one of the different circuitries other than the one the first contacting element is brought into contact with;
- a resilient element that is interposed between the first contacting element and the second contacting element, and is expandable and contractible in a longitudinal direction;
- a first connecting element that connects the resilient element and the first contacting element; and
- a second connecting element that connects the resilient element and the second contacting element; and an aligning unit that aligns the conductive contacts, wherein
the conductive contact holder includes holes communicating from bottom surfaces of the first guiding grooves or the second guiding grooves to outside of the conductive contact holder, and
the aligning unit includes a sucking section that sucks air inside the conductive contact holder through the holes.

14. The conductive contact unit according to claim 13, wherein at least a portion of the second contacting element projects from an external surface of the conductive contact holder, inside which the guiding grooves are formed, in a normal direction of the external surface.

* * * * *